United States Patent [19]
Collins et al.

[11] Patent Number: 5,315,473
[45] Date of Patent: May 24, 1994

[54] ISOLATED ELECTROSTATIC CHUCK AND EXCITATION METHOD

[75] Inventors: Kenneth S. Collins, San Jose; Edward A. Gritters, Felton, both of Calif.

[73] Assignee: Applied Materials, Inc., Santa Clara, Calif.

[21] Appl. No.: 823,280

[22] Filed: Jan. 21, 1992

[51] Int. Cl.$^5$ .............................................. H02N 13/00
[52] U.S. Cl. ................................. 361/234; 361/233; 361/235
[58] Field of Search ................... 361/233–235

[56] References Cited

U.S. PATENT DOCUMENTS

| | | | |
|---|---|---|---|
| 3,733,632 | 8/1988 | Ohmi et al. | 118/729 |
| 4,184,188 | 1/1980 | Briglia | 361/234 |
| 4,554,611 | 11/1985 | Lewin | 361/234 |
| 4,665,463 | 5/1987 | Ward et al. | 361/234 |
| 4,724,510 | 1/1988 | Wicker et al. | 361/234 |
| 4,962,441 | 9/1990 | Collins | 361/234 |
| 5,103,367 | 4/1992 | Horwitz et al. | 361/234 |
| 5,117,121 | 9/1992 | Watanabe et al. | 361/234 |
| 5,173,834 | 12/1992 | Sogoh | 361/234 |

FOREIGN PATENT DOCUMENTS

| | | | |
|---|---|---|---|
| 392399 | 10/1990 | European Pat. Off. | |
| 460954 | 12/1991 | European Pat. Off. | |
| 2050064 | 12/1980 | United Kingdom | 1402N/13/00 |

OTHER PUBLICATIONS

IBM Technical Disclosure Bulletin, vol. 31 No. 1 Jun. 1988.

*Primary Examiner*—A. D. Pellinen
*Assistant Examiner*—Aditya Krishnan
*Attorney, Agent, or Firm*—Birgit E. Morris

[57] ABSTRACT

An electrostatic clamp or chuck and method uses soft square wave, slew rate limited, A.C. clamping voltages and a balanced, differential drive for clamping flat articles such as semiconductor wafers to pedestals, wafer transfer blades, and the like, with a large ratio of clamping force to clamping voltage, reduced decay of the clamping force and associated nearly constant maximum clamping force, instantaneous elimination of remnant clamping force when the clamping voltage is removed (instant off operation), isolation of the clamped article from the clamping voltage, and substantial elimination of vibration. Preferably the A.C. frequency is 0.1 to 60 Hz. The instant off operation is enhanced by increasing the frequency as the clamping voltage is decreased.

37 Claims, 4 Drawing Sheets

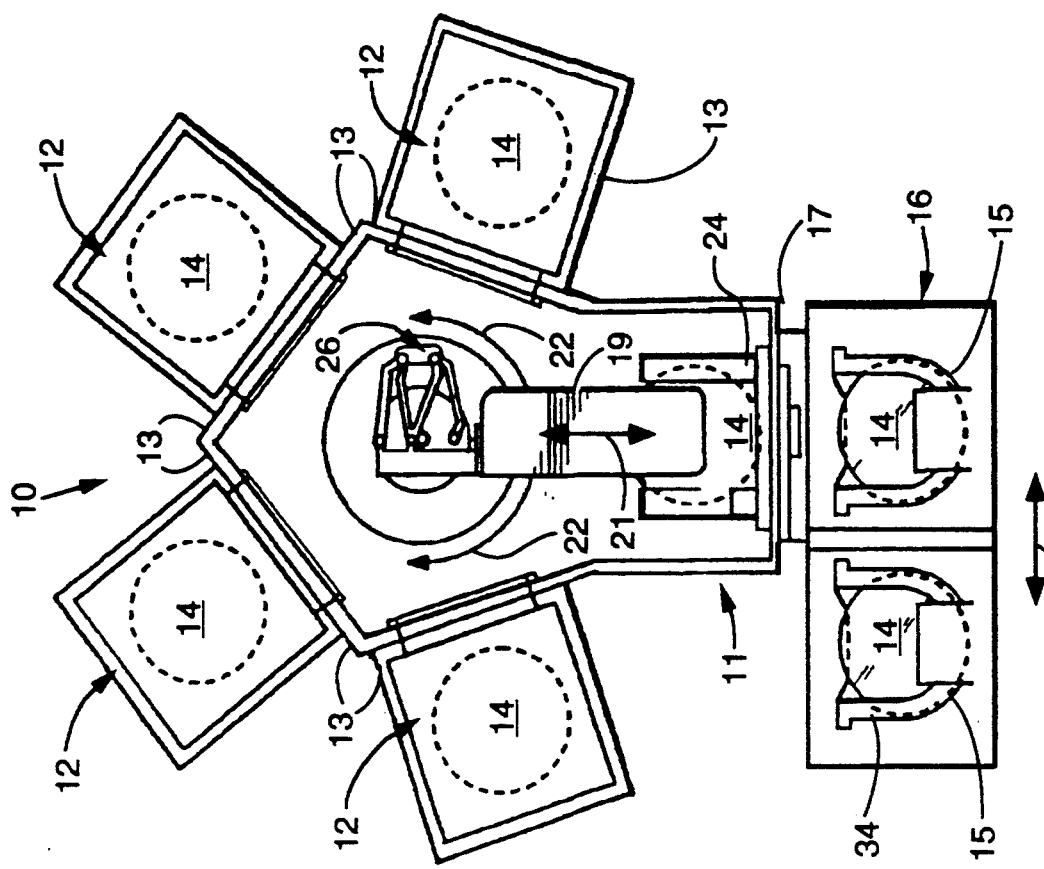
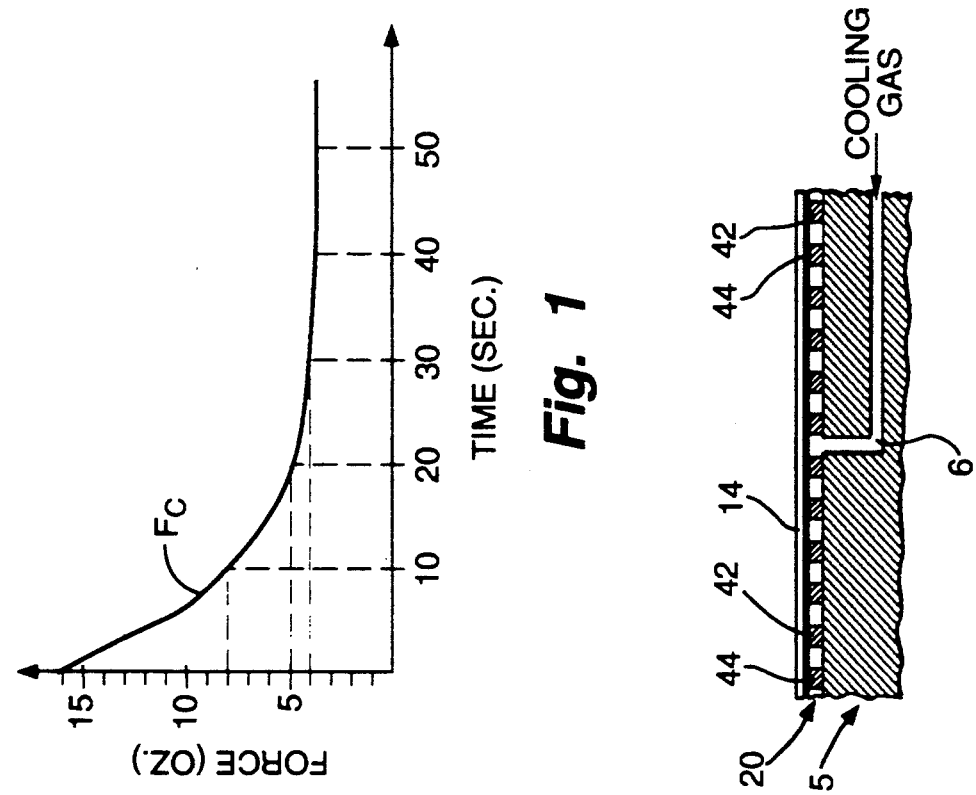
Fig. 1
Fig. 2A
Fig. 2B

ISOLATED ELECTROSTATIC CHUCK AND EXCITATION METHOD

BACKGROUND OF THE INVENTION

1. Field of the Invention

My present invention relates generally to electrostatic chucks. More particularly, my invention relates to ail electrostatic chuck which uses A.C. clamping voltages and to a method for clamping an article such as a semiconductor wafer to an electrostatic chuck with (1) a large ratio of clamping force to A.C. clamping voltage, (2) suppression of the decay of the clamping forte while the clamping voltage is being applied and (3) substantially instantaneous decay of the remnant clamping force when the clamping voltage is removed; and (4) without substantial vibration of the wafer.

2. Description of the Related Art

Electrostatic clamps or chucks have been used to hold wafers on pedestals, electrodes, etc., for processing in semiconductor wafer fabricating systems, In addition, robots which incorporate electrostatic clamping have been used to load and unload wafers in such systems.

Existing electrostatic clamps or chucks include unipolar electrode designs which use AC (alternating current) or DC (direct current) excitation. A single electrode, separated from the wafer by a dielectric material, is biased with a grounded AC or DC power supply. The wafer acts as the second electrode and, together with the intervening dielectric and the first electrode, forms a parallel plate capacitor. In a plasma processing reactor, the plasma references the wafer to system ground. Clamping force per volt of applied clamping voltage is high. However, a net charge develops on the wafer and on the chuck, which causes several problems.

First, the clamping force F, cannot be instantaneously turned off. A significant remnant remains, typically for as long as about 30 to 60 seconds after the clamping voltage is removed. As a consequence, once the clamping voltage is removed to permit wafer transfer to or from the pedestal or blade, one must either wait for the remnant clamping force to decay or apply a potentially excessive lifting force to remove the wafer. In short, the choice is between throughput-decreasing delay and potential damage to the wafer.

Also, the net charging of the wafer may damage sensitive integrated circuit devices formed on the wafer.

Alternative electrostatic clamp designs use a pair or multiple pairs of isolated bipolar electrodes which are buried beneath a dielectric layer, thereby isolating the electrodes from the wafer. AC or DC excitation is used. Either AC or DC excitation causes charge separation and/or polarization in the wafer without net charging. However, DC excitation devices suffer from the above-discussed decay of force with time to some low value, as well as the above-discussed turn-off delay when the DC clamping voltage is removed. AC designs experience vibration during the application of the AC clamping voltage. Also, unbalanced AC designs may suffer both clamping force decay and turn-off delay. FIG. 1 depicts the typical decay of the clamping force, $F_c$, which occurs despite the continued application of the 1000 volt DC clamping voltage that generates $F_c$. It is not unusual for $F_c$ to decay to about 25% of its original value within 20-30 seconds.

U.S. Pat. No. 4,184,188 illustrates a multiple electrode pair electrostatic wafer clamp and the general principles of electrostatic wafer clamps. The disclosed clamp includes a blade with a multiplicity of parallel interleaved positive and negative paired electrodes arranged on the blade surface. A dielectric layer is disposed over the positive and negative electrodes, forming a multiplicity of capacitors on the blade surface. During electrode energization by a D.C. (direct current) voltage, fringing electrostatic fields are generated between the positive electrodes and the negative electrodes of each capacitor pair. When a wafer is placed over the charged electrodes, the fringing electrostatic forces between the positive and negative electrodes pass through the wafer, creating a clamping force across the wafer and the electrodes by separating charges, so that negative charges in the wafer collect over the positively charged electrodes and positive wafer charges collect over the negating charged electrodes. The clamping force is directly proportional to this electrostatic force acting upon the wafer.

U.S. Pat. No. 4,733,632 discloses a representative prior art wafer transfer apparatus which uses a single electrode pair. The apparatus includes a movable arm, a D.C. electrostatic chuck mechanism having a vertically moving support member attached to the moving arm, and a mechanism for moving the support member. Wafer transport is accomplished by positioning the electrostatic chuck above the wafer to be transferred. The electrostatic chuck or robot has two semi-circular electrodes, which are electrically isolated from one another by an insulating film formed over each electrode and are arranged to fit over the periphery of the top surface of the wafer to be clamped. (The periphery of wafers generally is not processed, and therefore provides a clamping surface.)

SUMMARY OF THE INVENTION

In one aspect, my present invention is an improvement of the electrostatic clamp or blade which is the subject of my U.S. Pat. No. 4,962,441, entitled ISOLATED ELECTROSTATIC WAFER BLADE CLAMP, issued Oct. 9, 1990, which patent is incorporated by reference. My new A.C. voltage excitation technique provides instant turn-on and turn-off, without reduction in clamping force over time. Typically, the A.C. voltage excitation method is applied to interleaved electrodes, preferably of equal area, as described in the referenced patent. The electrodes preferably are differentially driven (neither side is grounded), balancing the system with respect to ground and reducing net charging of the electrodes. A soft square wave excitation voltage, preferably slew rate limited, is applied at a selected frequency of typically <0.1 Hz and <60 Hz, resulting in operation which is substantially vibration-free and is further characterized by the maximum force being substantially independent of clamping time and by instant "on" and "off" operation. Instant off operation is enhanced by increasing the frequency of the clamping voltage while decreasing the voltage.

In one particular aspect, my present invention which achieves the above and other objectives is embodied in a method of electrostatically clamping a workpiece such as a semiconductor wafer to a support comprising: applying across at least a pair of dielectric-covered electrodes an alternating current square-wave voltage, preferably slew rate limited, at the selected frequency to hold the workpiece flat against the support without vibration and substantially free of clamping force decay and residual clamping force. Preferably, removal of remnant charge and of clamping forces is facilitated by a turn-off step involving increasing the frequency, e.g., to over 60 Hz, while simultaneously decreasing the supply voltage.

In another, apparatus aspect, my invention is embodied in an electrostatic clamp which achieves the above and other objectives which comprises: at least one pair of electrodes formed on a base, with alternate electrodes being connected in common electrically; a layer of dielectric material over the electrodes and the base, the dielectric material having a thickness sufficient to prevent dielectric breakdown when a selected clamping voltage is applied; and means for applying an alternating current, square wave voltage at the selected frequency between the alternating electrodes for electrostatically clamping an article such as a semiconductor wafer positioned to the clamp, substantially without wafer vibration, without decay of the clamping force, and without residual clamping force.

In still more specific apparatus and method aspects, the voltage applied to each electrode is about $+/-500$ volts to $+/-1000$ volts. The frequency of the applied clamping voltage is 0.1 to 60 hertz, preferably 0.1 to 10 hertz and most preferably about 1 hertz. Preferably the device features of my referenced patent are used, i.e., the surface area of the positive and negative electrodes is equal, the thickness of the layer of dielectric material ranges from about 2 mils to about 15 mils, the ratio of the width of the electrodes and the distance between the electrodes is within the range of about 3/1 to about 2/1, the electrode width is within the range of about 12 mils to about 120 mils, and the distance between the electrodes is within the range of about 4 mils to about 40 mils.

The above-summarized features of my AC electrostatic clamp and my method of operating an AC electrostatic clamp are characterized by improved clamping performance for both wafer support pedestals or electrodes and wafer transfer blades. The operation is substantially vibration free, without decay of the clamping force, and provides instantaneous turn-off, i.e., is without residual clamping force. The operation provides a large, uniform clamping force across the clamp face per unit of applied voltage, for providing effective, uniform heat transfer between wafers and support pedestals and for preventing wafers from slipping or falling off during high accelerational and high decelerational movement of wafer transport chucks.

BRIEF DESCRIPTION OF THE DRAWING

The above and other objects and features of my invention will be more readily apparent from the following detailed description and appended claims, taken in conjunction with the drawings, in which:

FIG. 1 depicts the clamping force decay characteristics of prior art isolated electrostatic clamps;

FIG. 2A is a partial vertical section through a gas cooled wafer support electrode pedestal which incorporates an electrostatic wafer clamp embodying my present invention;

FIG. 2B a simplified top plan view of a semiconductor wafer processing system which incorporates an electrostatic wafer transport blade or clamp embodying my present invention;

DESCRIPTION OF THE PREFERRED EMBODIMENTS

Figure 3:
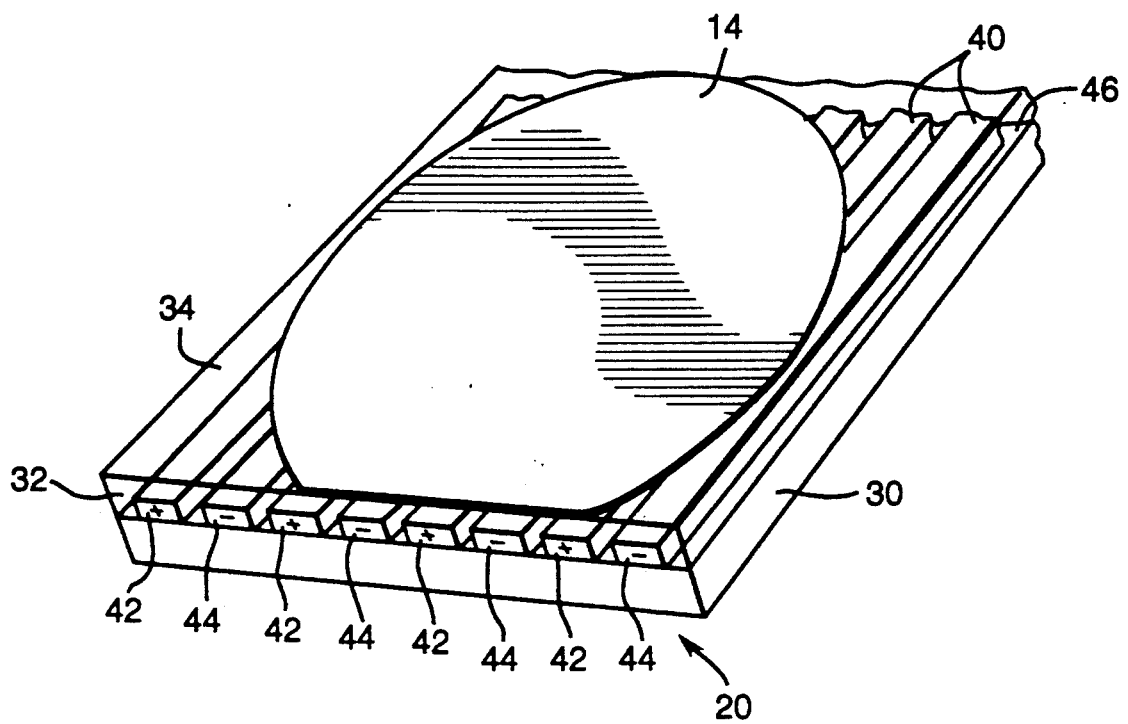
FIG. 3 is a top view of the electrostatic clamp of the present invention, illustratively shown clamping a semiconductor wafer.

1. Applicable Processing System a). Exemplary Wafer Support Pedestal

FIG. 2A depicts a wafer-supporting, electrode pedestal arrangement 5 which is useful in etch reactors. The illustrated pedestal 5 is a modification of that described in commonly assigned Cheng et al U.S. Pat. No. 4,842,683, issued Jun. 27, 1989, incorporated here by reference, in that the clamping ring or fingers have been replaced by an electrostatic clamp arrangement 20 which embodies my present invention. The electrostatic clamping pedestal 5 has numerous other applications, including to deposition chambers. However, etching is used by way of example, because of the large uniform clamping force that is required for adequate cooling of the wafer 14. In part, this requirement results from the use of a powered pedestal 5 (R.F. or other energy is applied to the pedestal) and the resultant high power density on the pedestal, which facilitates etching of the wafer 14, but typically requires fluid cooling of the pedestal. Preferably, the heat transfer between the pedestal 5 and the wafer 14 is enhanced by liquid cooling the pedestal and by applying cooling gas, illustratively via inlet 6, to the interface between the upper wafer-supporting surface of the pedestal and the supported wafer 14. Both heat transfer per se and the illustrated gas heat transfer arrangement impose high clamping force requirements.

b). Exemplary Wafer Transport Blade

FIG. 2B is a simplified top plan view of a multiple chamber integrated circuit processing system 10 that has been modified to include an electrostatic transport blade 19 embodying my present invention. The base, non-electrostatic clamp system 10 is described in detail in commonly assigned, Maydan et al U.S. Pat. No. 4,951,601, entitled MULTIPLE CHAMBER INTEGRATED PROCESS SYSTEM, issued Aug. 28, 1990, which patent is incorporated by reference.

Illustratively, the multiple chamber system 10 comprises an enclosed, generally polygonal-shaped vacuum loadlock chamber 11 which mounts several single wafer vacuum processing chambers 12 on associated loadlock chamber walls 13 for processing a multiplicity of wafers 14 initially contained in cassettes 15. The cassettes are mounted on an external cassette elevator 16 positioned adjacent the chamber wall 17, The external cassette elevator 16 is movable, is indexable horizontally and vertically, to position the cassettes for loading unprocessed wafers into loadlock chamber 11 and for receiving processed wafers from the chamber. A vertical indexable internal wafer support elevator 24 is used to store wafers within the loadlock chamber 11 for transfer to the various processing chambers 12 without breaking vacuum in the system 10. The wafer 14 loading and unloading is done by a robotic RΘ four-bar link mechanism 26. This mechanism mounts and imparts RΘ movement to the wafer-supporting blade 19, which incorporates electrostatic clamp 20. The blade movement includes reversible linear translation indicated by arrow 21 (R movement) and reversible rotation indicated by arrow 22 (Θ movement). Typically the combined R(Θ) movement is quasi-sinusoidal, involving relatively slow movement at the loadlock chamber and the processing chambers, and high rate accelerating (and decelerating) movement between the chambers.

The electrostatic clamp construction that is used in the wafer transport blade 19, FIG. 2B, can also be used in the wafer support pedestal 5, FIG. 2A, and vice versa.

2. Construction of Clamp 20

Turning now to FIG. 3, there is shown a schematized perspective view of my electrostatic clamp 20 which is used in pedestal 5 and in transport blade 19. The clamp configuration illustrated in FIG. 3 is rectangular, which is the configuration of the wafer transport blade 19, FIG. 2B. However, as applied to the exemplary pedestal 5, FIG. 2A, the clamp typically is arcuate-shaped, such as circular. The clamp 20 comprises a support 30 of non-conductive material such as the ceramic material $Al_2O_3$, and a protective dielectric layer 32 such as $Al_2O_3$ which encapsulates an array of capacitors 40. Each capacitor 40 includes an electrode 42, a corresponding parallel, opposite polarity electrode 44, and the intermediate dielectric. The electrodes 42 and 44 are formed on top surface 46 of the dielectric layer 30 and are alternately arranged forming interleaved alternating-polarity fingers. The electrodes are a conductive metal, such as but not limited to, silver, aluminum, or tungsten. The encapsulating layer of dielectric material 32 is formed over and between the electrodes 42 and 44, and forms a smooth planar top surface 34. To fabricate the electrostatic clamp on a base such as the wafer support pedestal or on the wafer transport blade, the base dielectric layer 30, followed by the other constituent components and layers, are formed on the top surface of the pedestal or the blade, using conventional deposition, masking and etching steps.

Please note, FIG. 3 is not to scale. Thicknesses and other dimensions are chosen in part for ease of viewing. Also, typically a greater number of electrodes 42 and 44 will be used, although a lesser number such as a single pair could be used.

To use the clamp, the wafer 14 is positioned on the pedestal 5 or blade 19 and an energizing A.C. voltage described below is applied to electrodes 42 and 44 to generate sufficient clamping force so that the wafer is firmly held against the pedestal 5, FIG. 2A, for processing such as etching, or so that the blade 19 may be moved between/among the various chambers 11 and 12, FIG. 2B, without slippage of or dropping the wafer.

Figure 4:
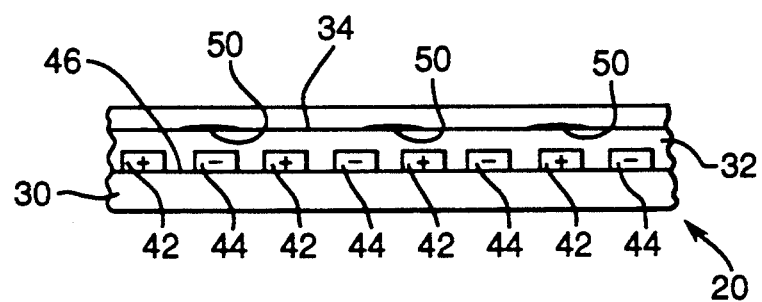
FIG. 4 is a side view of the electrostatic clamp of FIGS. 2A and 3 supporting a semiconductor wafer prior to electrostatic clamping.

FIG. 4 shows the clamp 20 positioned under a wafer 14 prior to clamping. The substrate or wafer 14 physically rests upon the planar dielectric surface 34 of the clamp 20. Air gaps 50 (exaggerated in size in FIG. 4 for clarity) exist between the dielectric plane 34 and the wafer substrate due to irregularities and bows in the wafer 14. In the air or vacuum environment of system 10, the air gaps 50 have a dielectric constant approaching 1.00. Accordingly, when a clamping voltage is applied, most of the voltage potential drop between the electrodes 42 and 44 and the wafer 14 is due to the air gaps 50. As discussed in detail below, the gaps 50 may dominate the voltage considerations required to electrostatically clamp the wafer 14 to the blade 19 with sufficient force to overcome slippage during movement, especially high accelerational movement.

3. A.C. Voltage Operation

Figure 5:
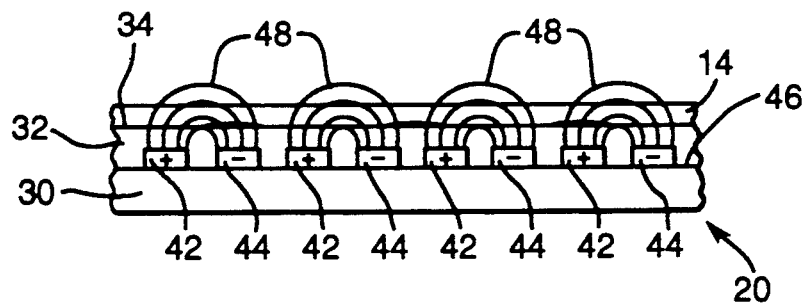
FIG. 5 is a side view of the electrostatic clamp of FIGS. 2A and 3 schematically showing electrostatic force lines during an electrostatic clamping operation.
Figure 6:
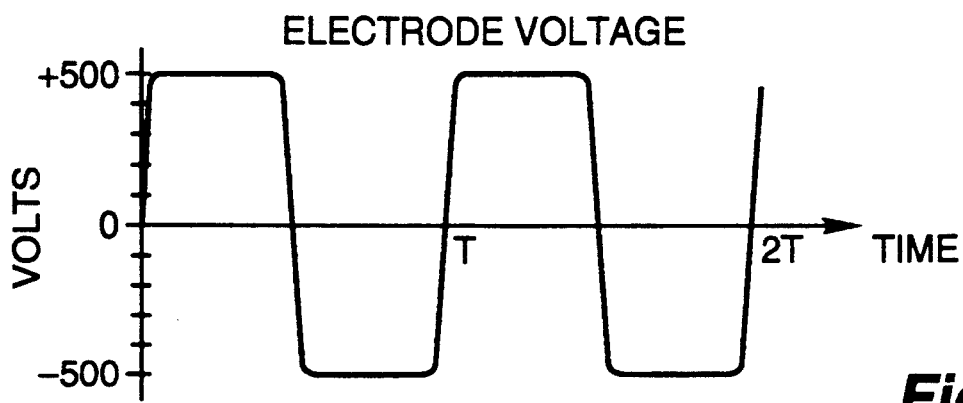
FIGS. 6 and 7 are graphs which schematically depict exemplary slew rate limited, square wave alternating voltages applied to the clamping electrodes to effect the clamping force $F_c$.
Figure 7:
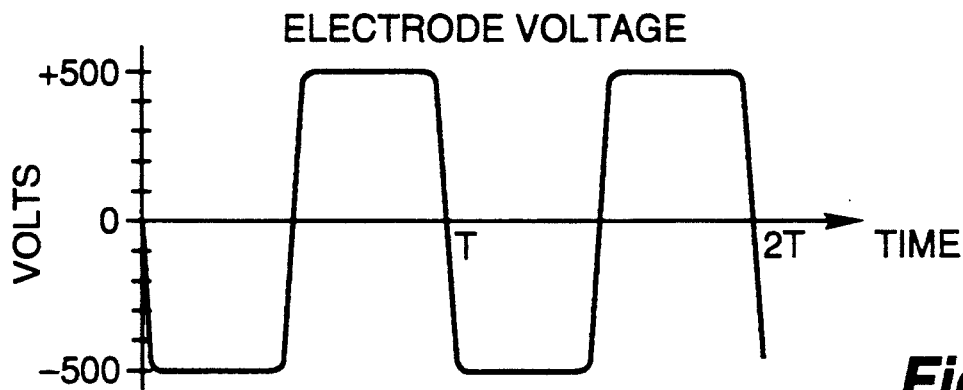

To effect wafer clamping, a square wave alternating current signal is applied to the electrodes 42 and 44. FIG. 9 depicts a simple exemplary switching amplifier circuit 60 which may be used for this purpose, to apply alternating square wave voltages, e.g., of 500 to 1000 volts amplitude. +(500 to 1000) volts input is applied to $S_1$ and $S_2$ while −(500 to 1000) volts input is applied $S_3$ and $S_4$. $S_1$ and $S_3$ are connected via an input resistor or resistive circuit to one electrode 42 (or 44); $S_2$ and $S_4$ are similarly connected to the other electrode 44 (or 42). Controller 62 alternately closes $S_1$ and $S_4$, then $S_3$ and $S_2$ at a selected frequency to effect the alternating square wave voltage signals on the electrodes 42 and 44 shown in FIGS. 6 and 7. This alternating energization of the conductors 42 and 44 of the capacitors 40, FIG. 3, and the resulting fringing A.C, electric field 48 which intercepts wafer 14, FIG. 5, effects alternating separation of charge in the wafer surface adjacent the clamp 20 and develops the clamping force, $F_c$ depicted in FIG. 8 that is directly proportional to the square of the magnitude of the electric field between the electrodes 42 and 44.

Figure 8:
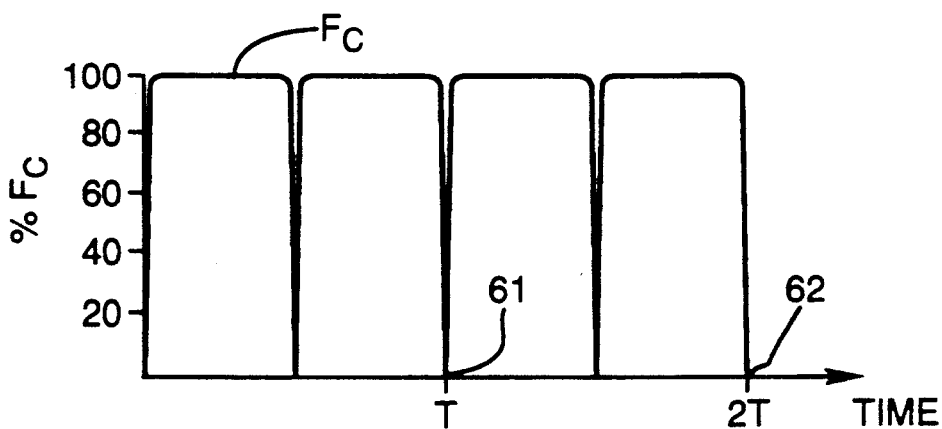
FIG. 8 is a graph depicting the uniform clamping force which results from the slew rate limited, square wave AC applied voltages of FIGS. 6 and 7.
Figure 9:
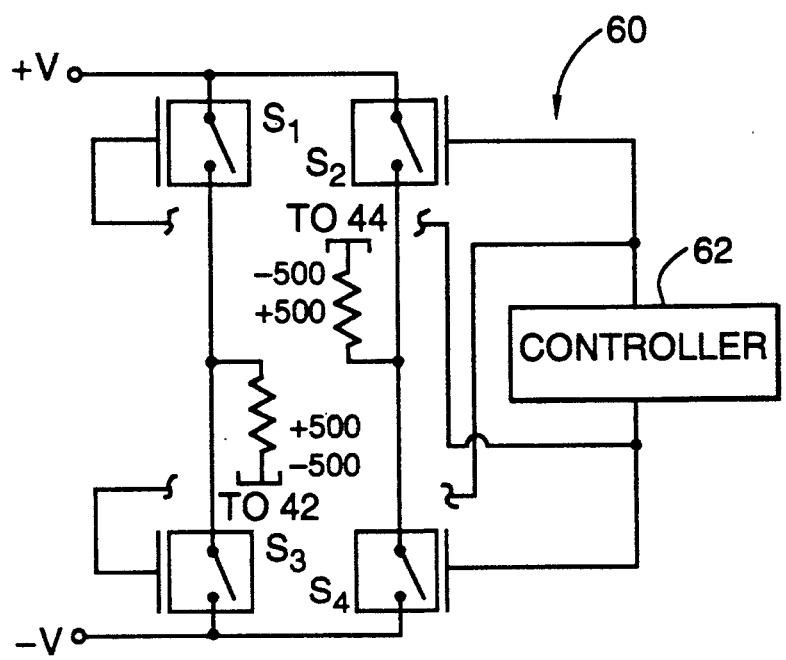
FIG. 9 is an electrical schematic of an exemplary switching amplifier.

As indicated in FIG. 8, the square wave form and, specifically, the rapid rise and fall of the voltages on the electrodes, provides a clamping force, $F_c$, that is maintained at a constant maximum value, despite the clamping%force being proportional to $V_c^2$. As a consequence of this squared relationship, the relatively slow rise and fall of typical sinusoidal waveforms would ordinarily result in substantial periodic variation in the force.

Figure 10:
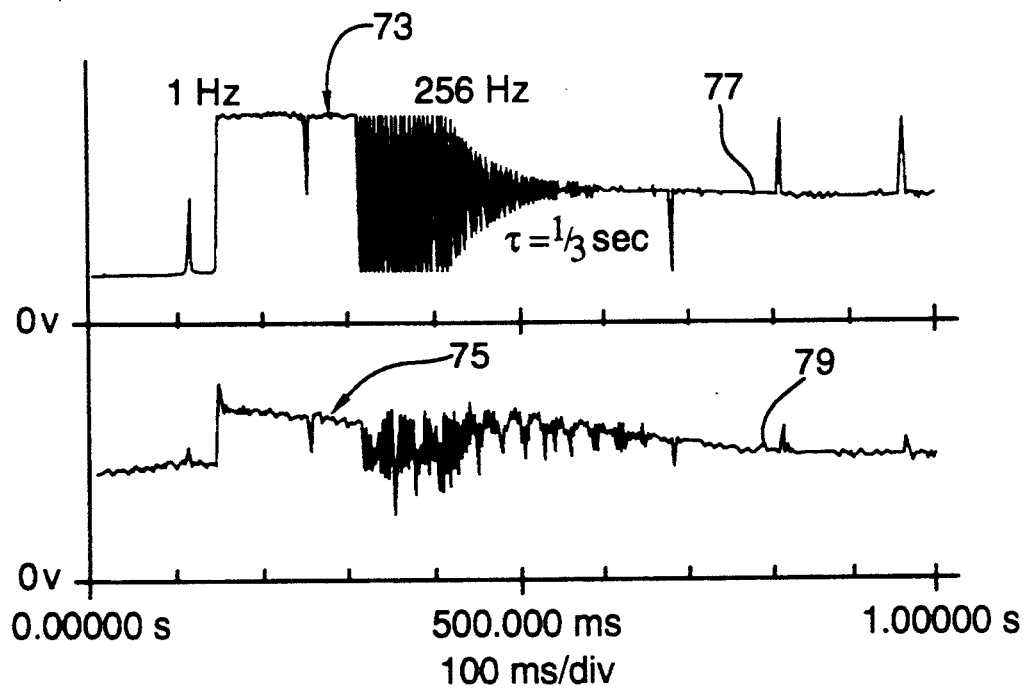
FIG. 10 depicts the presently preferred instant off method of operation of my electrostatic clamp.

Furthermore, I have discovered that the use of a clamping frequency within the range 0.1 to <60 Hz provides vibration-free operation which is characterized by the absence of force decay, and by near-instantaneous on operation, and permits near instantaneous off operation. FIG. 8 illustrates that when the clamping voltage is removed, for example, at times T and 2T, the clamping force drops instantaneously to a zero value, as shown at 61 and 62. Also, FIG. 10 indicates that the near instantaneous turn off characteristics are enhanced by decreasing the power supply/clamping voltage to zero and simultaneously increasing the frequency to a value much higher than the operating clamping frequency. FIG. 10 represents a digital sampling oscilloscope print-out of the applied clamping voltage (line 73) and the associated voltage applied to the wafer 14 (line 75). Initially, a 1 Hz, 1 kV$_{p-p}$ clamping voltage is applied. Starting at about 0.3 sec. along the chart's abscissa, the 1 Hz, 1 kV$_{p-p}$ clamping voltage is increased to 256 Hz, 0 V. in less than about 0.5 sec. driving the clamping voltage at the electrodes (point 77, line 73) to 0 V. That is, there is substantially no net remnant charge or voltage on the electrodes within 0.5 seconds after turn-off is initiated. Similarly, the remnant voltage at the wafer is substantially 0 V. (point 79, line 75). More generally, the preferred turn off frequency is about one order of magnitude greater than the clamping frequency, about 100–250 Hz. FIG. 10 also demonstrates the effective isolation provided by our clamp. During application of the 1 Hz 1 kV peak-to peak clamping voltage (supply voltage −1 kV), the isolated electrode arrangement limits the voltage applied to the semiconductor wafer to about 41 volts peak magnitude, which is well below the usual safety threshold of about 300 volts.

The lower frequency limit is chosen because below about 0.1 Hz, the clamping force decays with time, as described at length previously. The upper limit is about 60 Hz because above that frequency vibration (which increases with frequency) becomes noticeable. One Hz is preferred because vibration is the result of resonant frequencies which are absent or diminished at the lower frequencies within the preferred range and because the clamping force at this frequency is about ten times larger than the minimum value necessary to prevent wafer slippage in wafer transport applications, and to adequately thermally couple the wafer to the clamp or chuck, in interface gas-cooled clamping applications.

4. Optimal Clamp Configuration and Materials

Several parameters may be of primary significance in maximizing the electrostatic fringing in the area occupied by the wafer 14 and, thus, the clamping force: first, the dielectric material and its thickness used in the electrodes 42 and 44; second, the width of the electrodes; and third, the spatial relationship of distance between the electrodes.

Several factors should be considered in selecting a dielectric material. First, the force per unit voltage is directly proportional to the dielectric constant of the material. A second consideration is the dielectric strength of the material, which is defined as the voltage limit the dielectric material can withstand before breakdown occurs and the dielectric material becomes a conductor. Third is the dielectric static co-efficient of friction of the material as discussed above. A fourth consideration is the dielectric material's thermal properties. During wafer processing procedures such as etching, in the absence of adequate clamping, the wafer 14 can attain temperatures averaging 400 degrees Centigrade. Because a substantial portion of the wafer 14 thermal energy is absorbed by the dielectric layer 32, that dielectric must be capable of withstanding such temperatures without melting, cracking or otherwise deteriorating. For wafer heating chuck applications, the dielectric material should have high thermal conductivity.

Generally, the thinner the dielectric layer 32, the greater the electrostatic fringing in the area occupied by the wafer 14. However, there are practical limitations which limit the reduction of thickness of the dielectric layer. For dielectric layers approximately 1 mil or less in thickness, it has been found that the dielectric material breaks down and loses its insulating properties at voltages required to overcome air gaps. As a result, current passes through the wafer, which increases the probability of transistor damage. Therefore, in the preferred embodiment according to the present invention, a dielectric thickness range between approximately 2 mils at the low end and approximately 15 mils at the high end is defined. It will be considered obvious to those skilled in the art, that as technological advances are made in dielectric material, the low end of the range of dielectric thickness may be reduced accordingly.

By way of example, in the preferred embodiment chosen for purposes of illustration, dielectric layer 32 is made of $Al_2O_3$. $Al_2O_3$ is the most suitable dielectric material based on its performance with regard to each of the considerations discussed above. Other possible constituents include, but are not limited to, AlN, $Si_3N_4$ and $SiO_2$.

As described in my incorporated U.S. Pat. No. 4,962,441, the optimal width of electrodes 42 and 44 for maximizing electrostatic fringing has been found to be between approximately 120 mils and approximately 12 mils. The optimal spatial relationship or distance between the individual electrodes has been found to be between approximately 40 mils and approximately 6 mils. Also, a ratio of electrode width to spatial distance between electrodes of 3/1 to 2/1 maximizes electrostatic fringing in the area occupied by the wafer 14. In one embodiment, for a selection of 120 mils electrode width and a correlating ratio of 3/1, 40 mils distance between the electrodes maximizes the electrostatic fringing fields 48. In another embodiment, for a selection of electrode width of 90 mils and a 3/1 correlation ratio, 30 mils spacing between the electrodes maximizes electrostatic fringing 48. In yet another embodiment, an electrode width of 12 mils, a correlation ratio of 3/1, and 4 mils spacing between the electrodes maximize electrostatic fringing 46. In general, the inter-electrode spacing should be several times the dielectric thickness for sufficient fringing into the wafer substrate to occur.

It will be appreciated by those of usual skill in the art that the above-described correlation ratios all maintain a common characteristic, i.e., they maximize the ratio of the conductive surface area provided by the electrodes 42 and 44 surface relative to the non-conductive surface area.

5. EXAMPLES $V_c$ of about 760 volts and 0.1 Hz frequency will clamp the wafer flat against the pedestal or blade. (This value of $V_c$ is derived for the following representative parameters wafer thickness, 0.020 in; wafer radius, 2.5 in.; Poisson's ratio for the blade's silicon, 0.42; silicon modulus of elasticity, $3.1 \times 10^6$ lb./in.$^2$; plate constant, $E^* t^3)/12$) ($1 -$ Poissan's ratio$^2$); air gap between wafer and blade, worst case, 0.01 in; rectangular blade area 3.0 in. × 4.5 in. = 13.5 in.$^2$ = $8.7 \times 10^{-3}$ in.$^2$.)

a. Helium Cooling Chuck

An interdigitated electrostatic clamp 20 for clamping a standard 5 in. wafer to a pedestal 5 (FIG. 2B) uses interfacial helium gas at a pressure, typically, of 4–6 torr to provide the required heat transfer across a gad of about 0.5 to 1 mil between the wafer and the pedestal. Without the interstitial gas, a clamping voltage $V_c$ (peak-to-peak) of about 1000 volts would effect a clamping force, $F_c$ of about <4 to 6 torr, sufficient to securely clamp the wafer to the pedestal with heat transfer. However, the interfacial cooling gas pressure of 4–6 torr maximum raises the minimum clamping force requirement to about 12 torr. Using an $Al_2O_3$ dielectric thickness of about 2 mil, and a pedestal surface area which is 50% electrode and 50% gas surface, a clamping voltage of 2 $kV_{p-p}$ (supply voltage about $+/-$kV) provides a clamping pressure of about 13.6 torr, which is well above the required value of 12 torr for the 6 torr max. gas pressure. Also, during application of the 1 Hz 2 $kV_{p-p}$ clamping voltage, the isolated electrode arrangement limits the voltage applied to the semiconductor wafer to about 80 volts, which is well below the usual safety threshold of about 300 volts.

b). Wafer Transport Blade

Using a clamping potential difference $V_c = 1000$ volts to provide a significant safety margin, the resultant wafer clamping/flattening force is $F_c=2.56$ lb.$=11.4$ newtons (n). Thus, for a wafer mass of 0.015 kg, and static co-efficient of friction of 0.3 between the silicon wafer and alumina blade dielectric, the wafer will not begin to slip until a tangential acceleration of 24.8 g is reached, which provides a very considerable safety margin relative to the typical acceleration of arm 19 in the range 2-3 g. In short, the clamping force $F_c=11.4$ newtons provided by the clamping voltage $V_c=1$ $kV_{p-p}+/-500$ volts provides a safety margin of one order of magnitude.

My present invention has been described with reference to a few specific embodiments. The description is illustrative of the invention and is not to be construed as limiting the invention. Various modifications may occur to those skilled in the art without departing from the true spirit and scope of the invention as defined by the appended claims. For example, although the above-described interdigitated electrodes, spacings, dimensions and ratios are useful for maximizing clamping force, my AC electrostatic clamp system and method are useful in numerous other configurations, including simple, two electrode versions.

We claim:

1. A method of electrostatically clamping a workpiece to a support having at least a pair of dielectrically isolated electrodes comprising:
   applying to the paired electrodes an alternating current square-wave voltage of a frequency greater than 0.1 Hz and of a magnitude sufficient to clamp the workpiece flat against the support.

2. The method of claim 1 wherein the frequency of the applied voltage is with the range of about 0.1 to about 60 Hz.

3. The method of claim 2 wherein the frequency of the applied voltage is within the range of about 0.1 to about 10 Hz.

4. The method of claim 3 wherein the frequency of the applied voltage is about 1 Hz.

5. The method of claim 1 further comprising turning off the clamping force by increasing the frequency of the clamping voltage while simultaneously decreasing the magnitude of the voltage.

6. The method of claim 1 wherein the magnitude of the applied voltage is within the range of from about 500 to about 2000 volts.

7. The method of claim 5 wherein the turn off frequency is over 60 Hz.

8. The method of claim 1 wherein the applied voltage is slew rate limited.

9. The method of claim 1 wherein alternate electrodes are connected in common electrically.

10. A method of electrostatically clamping a semiconductor wafer to a wafer support which includes a layer of dielectric material over at least a pair of electrodes comprising:
    applying to the paired electrodes a differentially driven, balanced, alternating current square-wave voltage having a frequency of about 0.1 to about 60 Hz and a magnitude sufficient to clamp the semiconductor wafer flat against the support.

11. The method of claim 10 wherein the frequency of the applied voltage is in the range of from about 0.1 to about 10 Hz.

12. The method of claim 10 wherein the frequency of the applied voltage is about 1 Hz.

13. The method of claim 10 wherein the magnitude of the applied voltage is within the range of about 500 to about 2000 volts.

14. The method of claim 10 wherein alternate electrodes are connected in common electrically.

15. The method of claim 10 further comprising turning off the clamping force by increasing the frequency of the clamping voltage while simultaneously decreasing the magnitude of the voltage.

16. The method of claim 15 wherein the turn off frequency is over 60 Hz.

17. An electrostatic clamp comprising:
    an array of at least a pair of electrodes formed on a base, alternating electrodes being connected in common electrically;
    a layer of non-resilient dielectric material over the electrodes and the base, said dielectric material having a thickness sufficient to dielectrically isolate the electrodes and to prevent dielectric breakdown when a clamping voltage is applied; and
    means for applying a square-wave alternating voltage having a frequency greater than about 0.1 Hz between the alternating electrodes to generate an electrostatic clamping force between the clamp and a workpiece positioned thereon.

18. The clamp of claim 17 wherein the means for applying said voltage applies a voltage of a frequency within the range of from about 0.1 to about 60 Hz.

19. The clamp of claim 18 wherein the frequency of the applied voltage is within the range of from about 0.1 to about 10 Hz.

20. The clamp of claim 19 wherein the frequency of the applied voltage is about 1 Hz.

21. The clamp of claim 17 wherein the applied voltage is slew rate limited.

22. The clamp of claim 17 wherein said dielectric material is aluminum oxide.

23. The clamp of claim 22 wherein said dielectric material has a thickness of about 2 to about 15 mils.

24. The clamp of claim 17 wherein the magnitude of the applied voltage is within the range of from about 500 to about 2000 volts.

25. An electrostatic clamp comprising
    a flat base;
    an array comprising a plurality of electrodes formed on the base, alternate electrodes of the array being connected in common electrically;
    a layer of non-resilient dielectric material over the electrodes and the base, said dielectric material having a thickness sufficient to prevent dielectric breakdown when a clamping voltage is applied; and
    means for applying a differentially drive, balanced, square-wave, alternating voltage having a frequency within the range of about 0.1 to about 60 Hz between the alternating electrodes,
    whereby an electrostatic clamping force is generated between the clamp and a semiconductor wafer positioned thereon.

26. An electrostatic clamp of claim 25 wherein the frequency of the applied voltage is about 1 Hz.

27. An electrostatic clamp of claim 25 wherein said dielectric material is aluminum oxide.

28. An electrostatic clamp of claim 27 wherein said dielectric material has a thickness of about 2 to about 15 mils.

29. An electrostatic clamp of claim 25 wherein the magnitude of the applied voltage is about 500 to about 2000 volts.

30. An electrostatic clamp of claim 25 wherein the ratio of the width of the electrodes to the distance between the electrodes is about 3/1 to about 2/1.

31. An electrostatic clamp of claim 25 wherein the electrode width is about 12 to about 120 mils.

32. An electrostatic clamp of claim 25 wherein the distance between the electrodes is about 6 to about 40 mils.

33. An electrostatic clamp of claim 25 wherein the base is a wafer transfer blade.

34. An electrostatic clamp of claim 25 wherein the base is a wafer support pedestal adapted for applying heat transfer gas under pressure between the pedestal and the wafer thereon.

35. The method of claim 1 wherein said support is a wafer transfer blade.

36. The method of claim 10 wherein said support is a wafer transfer blade.

37. A method for transporting wafers in a wafer fabrication system utilizing an electrostatic wafer blade comprising
 a) placing a wafer to be transported on a top surface of the blade, said top surface having at least one pair of interleaved electrodes, alternating electrodes being connected in common electrically; said electrodes having a width and a spatial distance between said electrodes based on a correlated ratio defined by (electrode width/distance between electrodes) ranging from 3/1 to 21;
 b) applying a square wave alternating voltage having a frequency greater than 0.1 Hz between the alternating electrodes to generate an electrostatic clamping force between the blade and the wafer thereon; and
 c) accelerating the movement of the blade with a mechanical arm attached to the blade to effectuate controlled movement of the wafer in the system, whereby said clamping force holds the wafer onto the blade during accelerational movement.

* * * * *